(12) United States Patent
Rogel-Favila et al.

(10) Patent No.: US 9,638,749 B2
(45) Date of Patent: May 2, 2017

(54) SUPPORTING AUTOMATED TESTING OF DEVICES IN A TEST FLOOR SYSTEM

(71) Applicant: Advantest Corporation, Tokyo (JP)

(72) Inventors: Ben Rogel-Favila, San Jose, CA (US); James Fishman, Santa Clara, CA (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 14/736,139

(22) Filed: Jun. 10, 2015

(65) Prior Publication Data

US 2015/0355268 A1 Dec. 10, 2015

Related U.S. Application Data

(63) Continuation-in-part of application No. 14/515,422, filed on Oct. 15, 2014, and a continuation-in-part of application No. 14/515,417, filed on Oct. 15, 2014, and a continuation-in-part of application No. 14/515,421, filed on Oct. 15, 2014.

(60) Provisional application No. 62/009,130, filed on Jun. 6, 2014, provisional application No. 62/011,538, filed on Jun. 12, 2014.

(51) Int. Cl.
*G01R 31/01* (2006.01)
*G01R 31/28* (2006.01)

(52) U.S. Cl.
CPC .................. *G01R 31/2893* (2013.01)

(58) Field of Classification Search
CPC ............ G01R 31/2637; G01R 31/2801; G01R 31/2806; G01R 31/2808; G01R 31/281; G01R 31/2812; G01R 31/2834; G01R 31/2851; G01R 31/286; G01R 31/2863; G01R 31/2865; G01R 31/2867; G01R 31/2868; G01R 31/31905; G01R 31/31908; G01R 1/04; G01R 21/26
USPC ................ 324/73.1, 756.01, 756.02, 756.05, 324/757.01–757.05, 763, 750.22, 750.03, 324/750.16, 750.24
See application file for complete search history.

(56) References Cited

U.S. PATENT DOCUMENTS

| | | | | |
|---|---|---|---|---|
| 4,038,599 A | * | 7/1977 | Bove .................. | G01R 1/07314 324/73.1 |
| 4,560,058 A | * | 12/1985 | Enochs ................ | B65G 47/082 198/426 |
| 4,724,383 A | | 2/1988 | Hart | |
| 4,774,462 A | | 9/1988 | Black | |
| 4,777,434 A | | 10/1988 | Miller et al. | |
| 4,782,291 A | | 11/1988 | Blandin | |
| 4,888,549 A | | 12/1989 | Wilson et al. | |

(Continued)

*Primary Examiner* — Patrick Assouad
*Assistant Examiner* — Sean Curtis

(57) ABSTRACT

In an embodiment, a test floor apparatus includes at least one conveyor, a vertical stack buffer, and an automated handling station. The vertical stack buffer is operable to hold a plurality of DUT (device under test) receptacles and operable to place a DUT receptacle on the at least one conveyor to enable a corresponding DUT to be inserted into the DUT receptacle. The automated handling station is operable to access the DUT receptacle from the at least one conveyor and is operable to open the DUT receptacle to position the corresponding DUT in a manner that couples the corresponding DUT to an electrical interface of the DUT receptacle and that encloses the corresponding DUT inside the DUT receptacle to facilitate testing of the corresponding DUT.

20 Claims, 13 Drawing Sheets

(56) References Cited

U.S. PATENT DOCUMENTS

| | | | | |
|---|---|---|---|---|
| 5,310,039 | A * | 5/1994 | Butera | G01R 31/2851 198/346.2 |
| 5,329,227 | A | 7/1994 | Sinclair | |
| 5,555,422 | A | 9/1996 | Nakano | |
| 5,625,287 | A * | 4/1997 | Nakamura | B23Q 7/1447 324/750.19 |
| 5,633,598 | A | 5/1997 | Van Loan et al. | |
| 5,788,084 | A | 8/1998 | Onishi et al. | |
| 5,794,783 | A | 8/1998 | Carter | |
| 5,847,293 | A * | 12/1998 | Jones | G01R 31/2851 324/750.08 |
| 5,945,838 | A | 8/1999 | Gallagher et al. | |
| 6,008,636 | A * | 12/1999 | Miller | G01R 31/01 324/757.01 |
| 6,078,188 | A | 6/2000 | Bannai et al. | |
| 6,137,303 | A * | 10/2000 | Deckert | G01R 31/2831 324/757.03 |
| 6,194,908 | B1 | 2/2001 | Wheel et al. | |
| 6,198,273 | B1 | 3/2001 | Onishi et al. | |
| 6,204,679 | B1 * | 3/2001 | Gray, III | G11C 29/56 324/750.08 |
| 6,339,321 | B1 * | 1/2002 | Yamashita | G01R 31/01 324/750.14 |
| 6,354,792 | B1 * | 3/2002 | Kobayashi | G01R 31/316 257/E23.179 |
| 6,392,433 | B2 * | 5/2002 | Itasaka | G01R 1/0408 324/750.23 |
| 6,518,745 | B2 | 2/2003 | Kim et al. | |
| 6,526,841 | B1 | 3/2003 | Wanek et al. | |
| 6,583,638 | B2 | 6/2003 | Costello et al. | |
| 6,679,128 | B2 | 1/2004 | Wanek et al. | |
| 6,732,053 | B1 * | 5/2004 | Aragona | G01R 31/2834 702/108 |
| 7,070,323 | B2 | 7/2006 | Wanek et al. | |
| 7,091,737 | B2 * | 8/2006 | Norris | G01R 31/2868 324/750.05 |
| 7,151,388 | B2 * | 12/2006 | Gopal | G01R 31/2867 209/573 |
| 7,292,023 | B2 | 11/2007 | Dangelo et al. | |
| 7,339,387 | B2 * | 3/2008 | Dangelo | G01R 31/2863 324/750.05 |
| 7,532,023 | B2 | 5/2009 | Norris | |
| 7,550,964 | B2 | 6/2009 | Dangelo et al. | |
| 7,612,575 | B2 | 11/2009 | Ito et al. | |
| 7,800,393 | B2 | 9/2010 | Ito et al. | |
| 7,825,650 | B2 | 11/2010 | Casterton et al. | |
| 7,884,631 | B2 * | 2/2011 | Co | G11C 29/56 324/757.01 |
| 7,929,303 | B1 * | 4/2011 | Merrow | G11B 33/128 324/73.1 |
| 7,960,992 | B2 * | 6/2011 | Co | G11C 29/56016 324/757.01 |
| 8,237,461 | B2 | 8/2012 | Kitazume et al. | |
| 8,248,091 | B2 * | 8/2012 | Cheng | G01R 1/07371 324/754.07 |
| 8,269,507 | B2 | 9/2012 | Hall | |
| 9,110,129 | B1 * | 8/2015 | Ames | G01R 31/2808 |
| 2001/0035058 | A1 * | 11/2001 | Wanek | G01R 31/2849 73/865.6 |
| 2002/0011862 | A1 | 1/2002 | Kvanvig et al. | |
| 2002/0053045 | A1 * | 5/2002 | Gillenwater | G06F 11/2273 714/38.14 |
| 2002/0109518 | A1 | 8/2002 | Saito et al. | |
| 2002/0130654 | A1 | 9/2002 | Tauchi et al. | |
| 2002/0149389 | A1 * | 10/2002 | Bjork | G01R 31/2893 324/750.05 |
| 2002/0175697 | A1 | 11/2002 | Miller et al. | |
| 2003/0085160 | A1 * | 5/2003 | Shim | G01R 31/2887 209/573 |
| 2003/0121337 | A1 | 7/2003 | Wanek et al. | |
| 2003/0173950 | A1 * | 9/2003 | Flach | G01R 31/2853 324/756.05 |
| 2004/0062104 | A1 * | 4/2004 | Muller | G01R 31/2891 365/201 |
| 2004/0066207 | A1 * | 4/2004 | Bottoms | G01R 31/2886 324/756.02 |
| 2004/0178808 | A1 | 9/2004 | Fenk | |
| 2006/0066293 | A1 * | 3/2006 | Gopal | G01R 31/2867 324/750.14 |
| 2007/0063724 | A1 * | 3/2007 | Roberts | G01R 31/2893 324/750.16 |
| 2008/0038098 | A1 * | 2/2008 | Ito | G01R 31/31718 414/222.01 |
| 2008/0042667 | A1 * | 2/2008 | Yamashita | G01R 31/31718 324/750.03 |
| 2008/0079456 | A1 * | 4/2008 | Lee | G01R 31/2893 324/750.03 |
| 2008/0136439 | A1 * | 6/2008 | Adam | G01R 31/2889 324/750.08 |
| 2008/0143129 | A1 | 6/2008 | Wong et al. | |
| 2009/0195264 | A1 * | 8/2009 | Tsen | G01R 31/2867 324/750.03 |
| 2009/0217093 | A1 * | 8/2009 | Co | G01R 31/31723 714/30 |
| 2011/0012631 | A1 * | 1/2011 | Merrow | G11B 33/128 324/750.03 |
| 2011/0012632 | A1 * | 1/2011 | Merrow | G11B 5/4555 324/750.03 |
| 2011/0074458 | A1 * | 3/2011 | Di Stefano | G01R 1/0466 324/757.01 |
| 2012/0068725 | A1 | 3/2012 | Pagani | |
| 2012/0139572 | A1 * | 6/2012 | Kim | G01R 31/2889 324/754.07 |
| 2012/0249177 | A1 * | 10/2012 | Choi | G01R 31/2893 324/756.02 |
| 2012/0291999 | A1 | 11/2012 | Lewinnek et al. | |
| 2013/0057310 | A1 * | 3/2013 | Hasegawa | H01L 24/75 324/757.01 |
| 2013/0200913 | A1 * | 8/2013 | Panagas | G01R 1/0441 324/756.02 |
| 2013/0200916 | A1 * | 8/2013 | Panagas | G01R 1/0441 324/757.01 |
| 2014/0015559 | A1 * | 1/2014 | Lee | G01R 1/0466 324/756.02 |
| 2014/0184255 | A1 * | 7/2014 | Johnson | G01R 31/2834 324/750.16 |
| 2014/0218063 | A1 * | 8/2014 | Roberts, Jr. | G01R 31/2601 324/756.02 |
| 2014/0306728 | A1 * | 10/2014 | Arena | G01R 31/2808 324/750.08 |
| 2015/0028908 | A1 | 1/2015 | Kushnick et al. | |
| 2015/0061713 | A1 * | 3/2015 | Shia | G01R 1/07371 324/750.16 |
| 2015/0233967 | A1 | 8/2015 | Thordarson et al. | |
| 2015/0234006 | A1 * | 8/2015 | Richards | G01R 31/308 324/756.02 |
| 2015/0355229 | A1 * | 12/2015 | Rogel-Favila | G01R 31/26 324/756.02 |
| 2015/0355230 | A1 * | 12/2015 | Rogel-Favila | G01R 31/26 324/756.01 |
| 2015/0355231 | A1 * | 12/2015 | Rogel-Favila | G01R 31/26 324/750.13 |
| 2015/0355268 | A1 * | 12/2015 | Rogel-Favila | G01R 31/2893 324/750.08 |
| 2015/0355270 | A1 * | 12/2015 | Rogel-Favila | G01R 31/2874 324/750.08 |
| 2015/0355271 | A1 * | 12/2015 | Rogel-Favila | G01R 31/2874 324/750.08 |
| 2015/0355279 | A1 * | 12/2015 | Rogel-Favila | G01R 31/2893 324/750.25 |

* cited by examiner

SUPPORTING AUTOMATED TESTING OF DEVICES IN A TEST FLOOR SYSTEM

CROSS-REFERENCE TO RELATED APPLICATIONS

This application is a Continuation-In-Part of and claims priority to U.S. patent application Ser. No. 14/515,422, filed on Oct. 15, 2014, which claims the benefit of and priority to U.S. Provisional Application No. 62/009,130, filed on Jun. 6, 2014, which are hereby incorporated by reference in their entirety. This application is a Continuation-In-Part of and claims priority to U.S. patent application Ser. No. 14/515,417, filed on Oct. 15, 2014, which claims the benefit of and priority to U.S. Provisional Application No. 62/009,130, filed on Jun. 6, 2014, which are hereby incorporated by reference in their entirety. This application is a Continuation-In-Part of and claims priority to U.S. patent application Ser. No. 14/515,421, filed on Oct. 15, 2014, which claims the benefit of and priority to U.S. Provisional Application No. 62/009,130, filed on Jun. 6, 2014, which are hereby incorporated by reference in their entirety.

This application claims the benefit of and priority to U.S. Provisional Application No. 62/011,538, filed on Jun. 12, 2014, which is hereby incorporated by reference in its entirety.

This application is related to U.S. patent application Ser. No. 14/736,070, U.S. patent application Ser. No. 14/736,107, and U.S. patent application Ser. No. 14/736,166, which are hereby incorporated by reference in their entirety.

FIELD

Embodiments relate to testing of devices. More specifically, embodiments relate to automated testing of devices

BACKGROUND

Bringing a product to market generally entails a design stage, a manufacturing stage, and a testing stage. Given the competition of the marketplace, it makes sense not to de-prioritize anyone of these stages. For example, decisions made during the design stage influence whether the product will be manufacturable and/or will be testable. Also, the testing stage offers the opportunity to detect design flaws and to uncover manufacturing defects.

Typically, the testing stage is crafted as a product-centric solution or as an equipment-centric solution. In the product-centric solution, the testing set-up is focused and optimized for testing a specific product. If a different product is to be tested, another testing set-up is developed for the different product. In the case of the equipment-centric solution, specific testing equipment forms the foundation of the testing set-up. Measures are taken to deal with the limitations of the specific testing equipment in implementing the testing set-up.

SUMMARY

A new paradigm for automated device testing is presented. Instead of focusing on testing numerous of the same devices in the same testing environment (e.g., under the same temperature conditions) with the same test, the focus shifts to establishing an individualized automated testing environment for the device under the new paradigm. Due to the individualized automated testing environment, barriers such as the type of device under test (DUT) that may be tested, the type of test that may be performed, and the test conditions that may be furnished are overcome. Consequently, different DUT types, different test types, and different test conditions are possible on a test floor under the new paradigm. DUT receptacles, DUT testing modules, testers, test floor equipment, and automated control implement the new paradigm for automated device testing.

Herein, the discussion will focus on the test floor equipment.

In an embodiment, a test floor apparatus includes at least one conveyor, a vertical stack buffer, and an automated handling station. The vertical stack buffer is operable to hold a plurality of DUT (device under test) receptacles and operable to place a DUT receptacle on the at least one conveyor to enable a corresponding DUT to be inserted into the DUT receptacle. The automated handling station is operable to access the DUT receptacle from the at least one conveyor and is operable to open the DUT receptacle to position the corresponding DUT in a manner that couples the corresponding DUT to an electrical interface of the DUT receptacle and that encloses the corresponding DUT inside the DUT receptacle to facilitate testing of the corresponding DUT.

In another embodiment, a test floor apparatus is described comprising: at least one conveyor; a first vertical stack buffer operable to hold a plurality of first type DUT (device under test) receptacles and operable to place a first type DUT receptacle on the at least one conveyor to enable a first type DUT to be inserted into the first type DUT receptacle; a second vertical stack buffer operable to hold a plurality of second type DUT receptacles and operable to place a second type DUT receptacle on the at least one conveyor to enable a second type DUT to be inserted into the second type DUT receptacle; and an automated handling station operable to access at least one of the first type DUT receptacle or the second type DUT receptacle from the at least one conveyor and operable to open the at least one of the first type DUT receptacle or the second type DUT receptacle to position at least one of the first type DUT or the second type DUT in a manner that couples the at least one of the first type DUT or the second type DUT to an electrical interface of the at least one of the first type DUT receptacle or the second type DUT receptacle and that encloses the at least one of the first type DUT or the second type DUT inside the at least one of the first type DUT receptacle or the second type DUT receptacle to facilitate testing of the at least one of the first type DUT or the second type DUT.

In yet another embodiment, a method is disclosed comprising: responsive to selection of a first type DUT (device under test) on which to perform testing, causing a first type DUT receptacle to be placed on a first conveyor by one of a plurality of vertical stack buffers operable to hold a plurality of types of DUT receptacles; using the first conveyor to transport the first type DUT receptacle; using a second conveyor to transport the first type DUT; accessing the first type DUT receptacle and opening the first type DUT receptacle; and accessing the first type DUT from the second conveyor and positioning the first type DUT in a manner that couples the first type DUT to an electrical interface of the first type DUT receptacle and that encloses the first type DUT inside the first type DUT receptacle to facilitate testing of the first type DUT.

BRIEF DESCRIPTION OF THE DRAWINGS

The accompanying drawings, which are incorporated in and form a part of this specification, illustrate embodiments, together with the description, serve to explain the principles of the disclosure.

DETAILED DESCRIPTION

Reference will now be made in detail to embodiments, examples of which are illustrated in the accompanying drawings. While the disclosure will be described in conjunction with these embodiments, it should be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description, numerous specific details are set forth in order to provide a thorough understanding. However, it will be recognized by one of ordinary skill in the art that embodiments may be practiced without these specific details.

The individualized automated testing environment offers a wide range of flexibility. As will be explained in detail, on the device-side, a DUT (device under test) receptacle offers a uniform size and shape and a uniform physical/air/electrical interface irrespective of the size, the shape, and type of the device under test (DUT). On the testing-side, the DUT testing modules, testers, test floor equipment, and automated control are designed to interact with the uniform size and shape and the uniform physical/air/electrical interface provided by the DUT receptacle. Detailed disclosure of the test floor equipment is provided herein. While the DUT receptacle is described in FIGS. 7-9, detailed disclosure of the DUT receptacle is found in the applications incorporated by reference herein. While the DUT testing module is described in FIGS. 10-12, detailed disclosure of the DUT testing module is found in the applications incorporated by reference herein. While the tester is described in FIG. 13, detailed disclosure of the tester is found in the applications incorporated by reference herein. Further, detailed disclosure of automated control is found in the applications incorporated by reference herein.

DUT Receptacle

Figure 7:
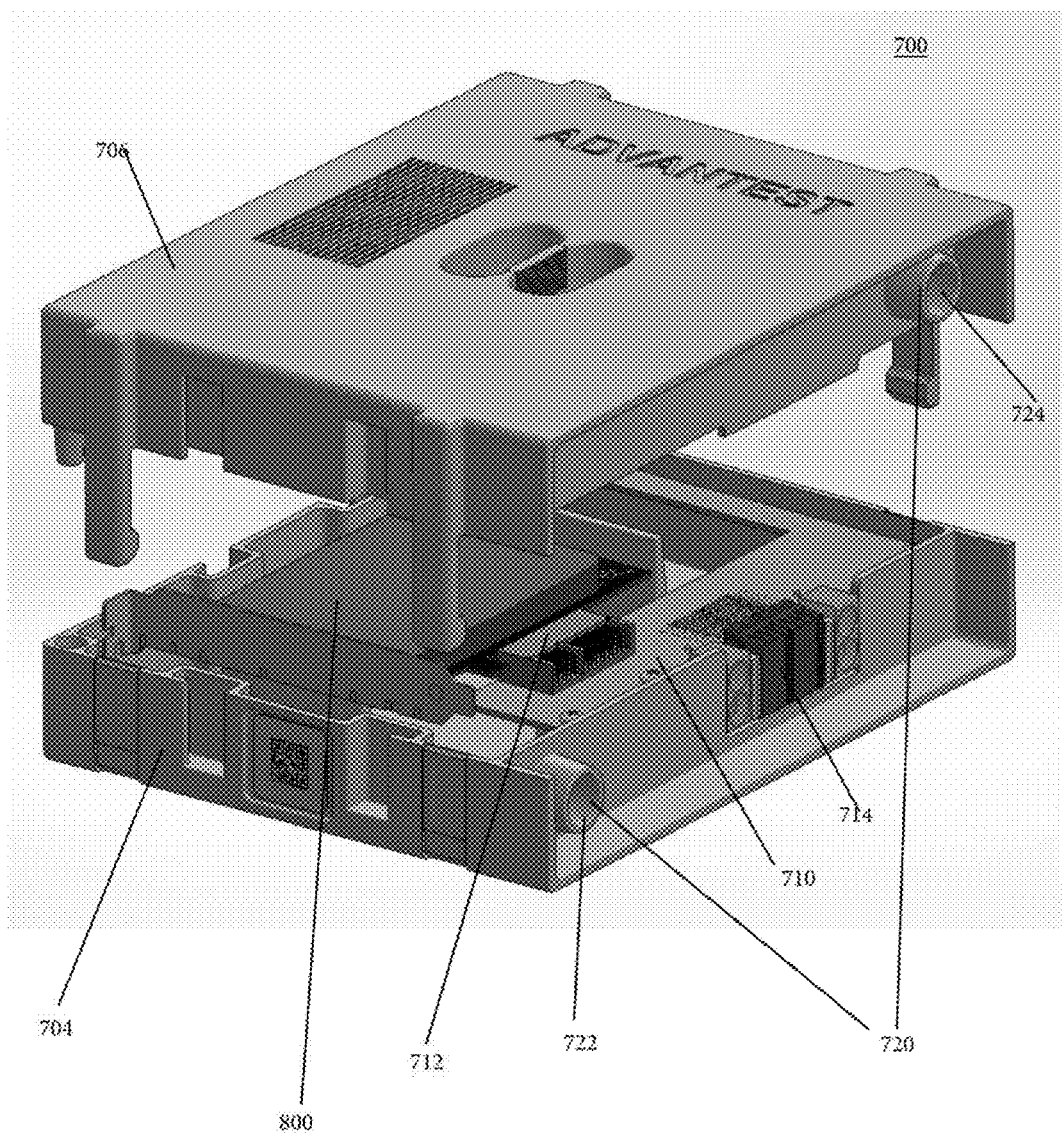
FIG. 7 illustrates an exploded view of a DUT receptacle in accordance with an embodiment, showing a DUT.
Figure 8:
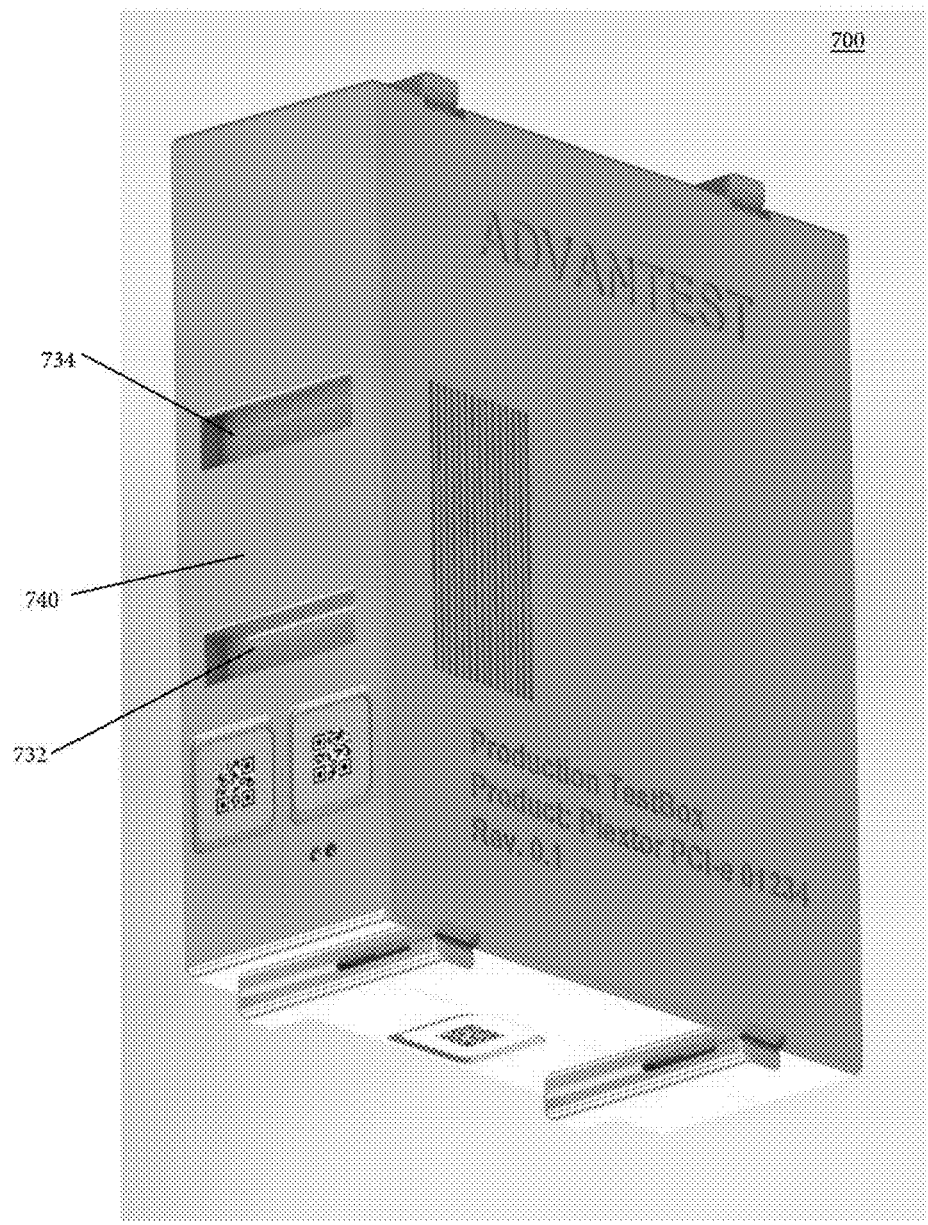
FIG. 8 illustrates a front perspective view of the DUT receptacle of FIG. 7 in accordance with an embodiment.
Figure 9:
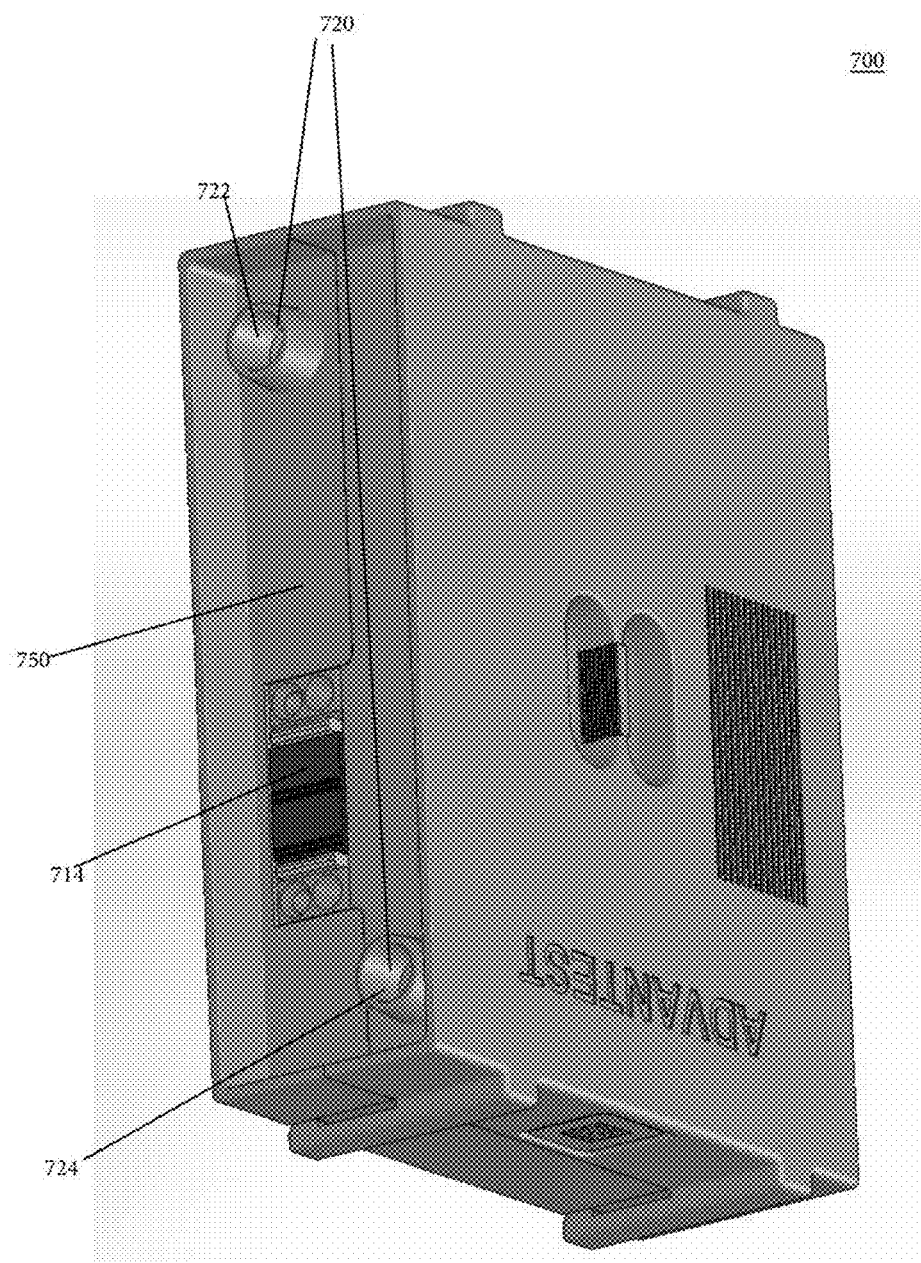
FIG. 9 illustrates a rear perspective view of the DUT receptacle of FIG. 7 in accordance with an embodiment.

Now, a brief description will be given of the DUT receptacle. FIG. 7 illustrates an exploded view of a DUT receptacle 700 in accordance with an embodiment, showing a DUT 800. FIG. 8 illustrates a front perspective view of the DUT receptacle 700 of FIG. 7 in accordance with an embodiment FIG. 9 illustrates a rear perspective view of the DUT receptacle 700 of FIG. 7 in accordance with an embodiment. It should be understood that the DUT receptacle 700 is not limited to the illustrations in FIGS. 7-9.

With reference to FIGS. 7-9, the DUT receptacle 700 provides a uniform size and shape and a uniform physical/air/electrical interface for a device under test (DUT) 800. There are may different types of devices (or DUTs) including, but not limited to, network cards, graphics cards, chips, microprocessors, hard disk drives (HDD), and solid state drives (SSD). Even within these exemplary device types, there are different device sub-types. As an example, a SSD with 500 GB storage capacity is a different type of device with respect to a SSD with 1 TB storage capacity. That is, the SSD with 1 TB storage capacity possesses features and characteristics that are different from the features and characteristics of the SSD with 500 GB storage capacity. Hence, the testing goals/requirements for the SSD with 1 TB storage capacity differ from the testing goals/requirements for the SSD with 500 GB storage capacity. Consequently, the SSD with 500 GB storage capacity is a different device type relative to the SSD with 1 TB storage capacity.

Moreover, there are numerous form factors and published specifications for devices to comply with to support compatibility and interoperability. Examples of form factors and published specifications include, but are not limited to, 3.5" HDD, 2.5" HDD, 2.5" SSD, 1.8" SSD, SATA, iSATA, PCIe, mPCIe, Fibre Channel, SAS, and USB. Rather than designing automated testing equipment (e.g., DUT (device under test) testing modules, testers, test floor equipment, and/or automated control) for a specific device type and/or a specific form factor and/or a specific published specification, the automated testing equipment (e.g., DUT testing modules, testers, test floor equipment, and/or automated control) is crafted for the uniform size and shape and the uniform physical/air/electrical interface offered by the DUT receptacle 700. Consequently, the automated testing equipment (e.g., DUT testing modules, testers, test floor equipment, and/or automated control) may be utilized with different types of devices (or DUTs) of different form factors and different published specifications.

Referring again to FIG. 7, the DUT receptacle 700 is configured to enclose and to hold inside a device under test (DUT) 800 in accordance with an embodiment. The interior of the DUT receptacle 700 may also be configured to enclose and hold inside a plurality of devices under test (DUTs) 800 in accordance with an embodiment. As shown in FIG. 7, the DUT receptacle 700 includes a base 704 to accommodate the DUT 800 and a lid 706 to securely couple to the base 704 in accordance with an embodiment. It should be understood that the DUT receptacle 700 may have any one of other configurations.

The DUT receptacle 700 also includes several other features. The DUT receptacle 700 includes an electrical interface 710 and an air flow interface 720. The electrical interface 710 includes a first connector 712 to couple to and to electrically communicate with the DUT 800 and a second connector 714 to couple to and to electrically communicate with automated testing equipment (e.g., DUT testing modules, testers, test floor equipment, and/or automated control). The air flow interface 720 includes a first air guide 722 to receive air flow from automated testing equipment (e.g., DUT testing modules, testers, test floor equipment, and/or automated control) and a second air guide 724 to output the air flow to automated testing equipment (e.g., DUT testing modules, testers, test floor equipment, and/or automated control). The air flow immerses the interior of the DUT receptacle 700 to maintain the interior of the DUT receptacle 700 at a controlled temperature, which is measured by a temperature sensor (not shown) inside the DUT receptacle 700 and reported to automated testing equipment (e.g., DUT testing modules, testers, test floor equipment, and/or automated control) via the electrical interface 710.

Now referring to FIG. 8, a front side 740 of the DUT receptacle 700 includes a first slot 732 and a second slot 734. The first slot 732 and the second slot 734 facilitate griping of the DUT receptacle 700 by automated testing equipment (e.g., testers and/or test floor equipment) for movement from one location to another location in accordance with an embodiment. It should be understood that the DUT receptacle 700 may be moved in any other manner.

With reference to FIG. 9, a rear side 750 of the DUT receptacle 700 includes the second connector 714 to couple to and to electrically communicate with automated testing equipment (e.g., DUT testing modules, testers, test floor equipment, and/or automated control) and the air flow interface 720, which has the first air guide 722 to receive air flow from automated testing equipment (e.g., DUT testing modules, testers, test floor equipment, and/or automated control) and the second air guide 724 to output the air flow to automated testing equipment (e.g., DUT testing modules, testers, test floor equipment, and/or automated control).

DUT Testing Module

Figure 10:
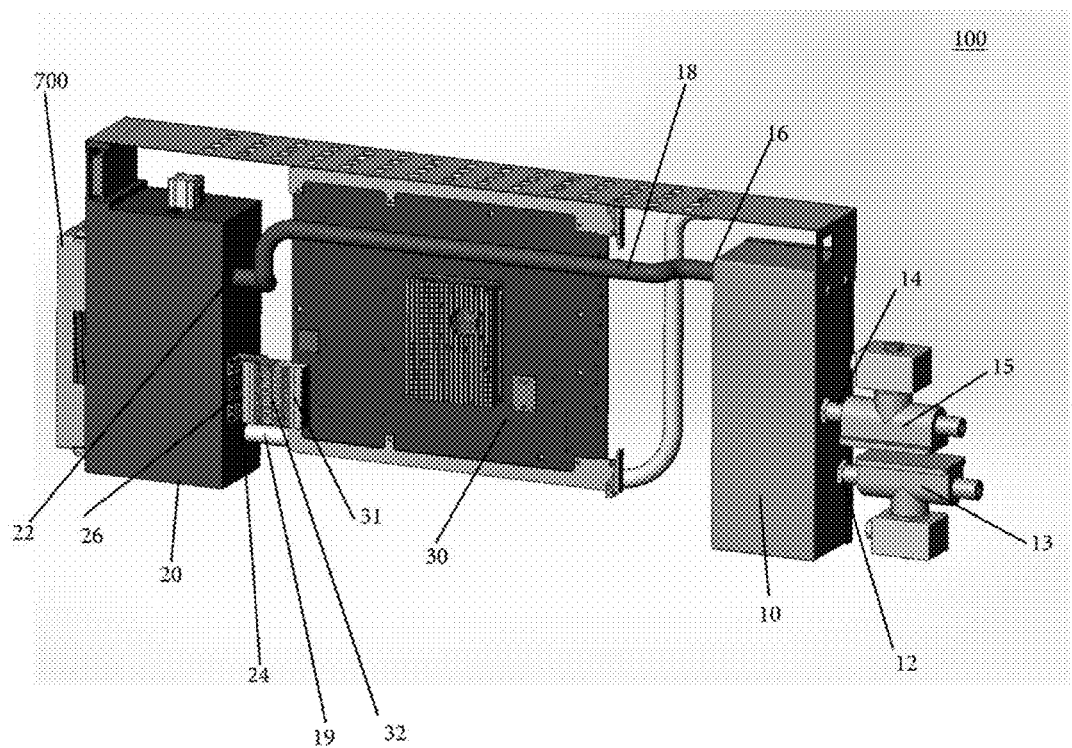
FIG. 10 depicts a side view of a DUT testing module in accordance with an embodiment, showing the DUT testing module without housing walls and showing a DUT receptacle inserted into the DUT testing module.
Figure 11:
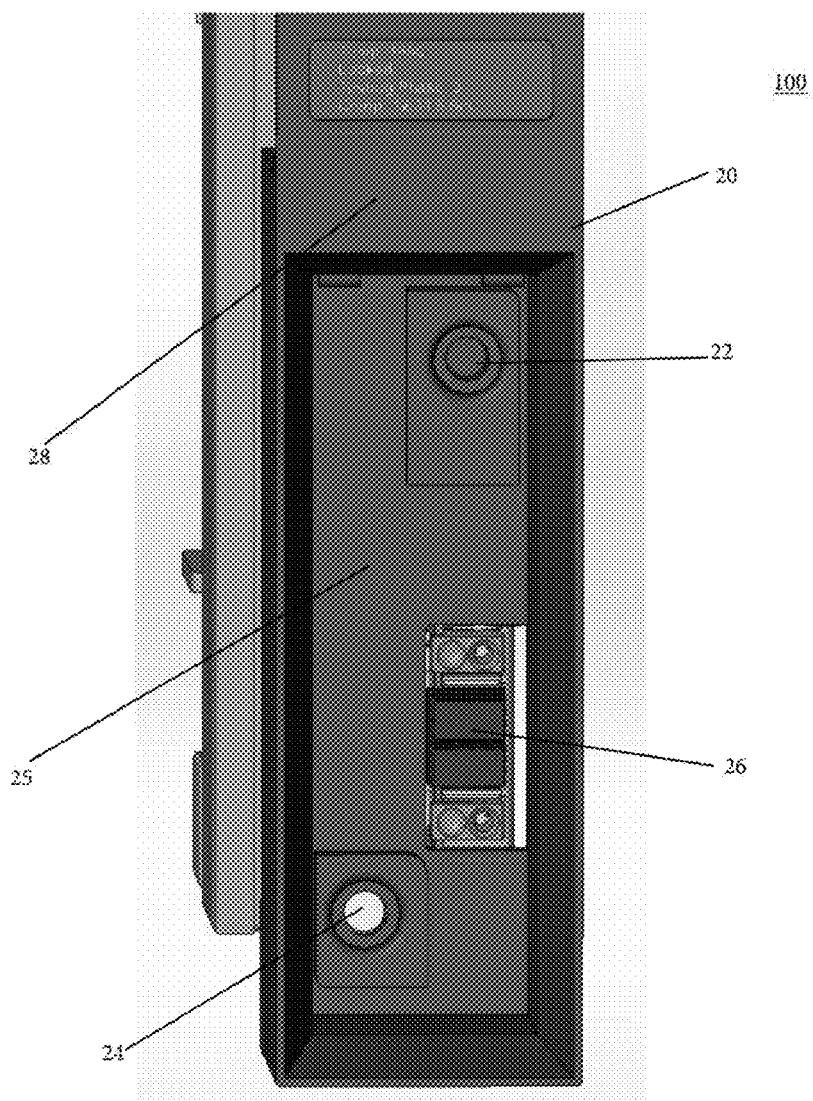
FIG. 11 shows a front view of the DUT testing module of FIG. 10 in accordance with an embodiment.
Figure 12:
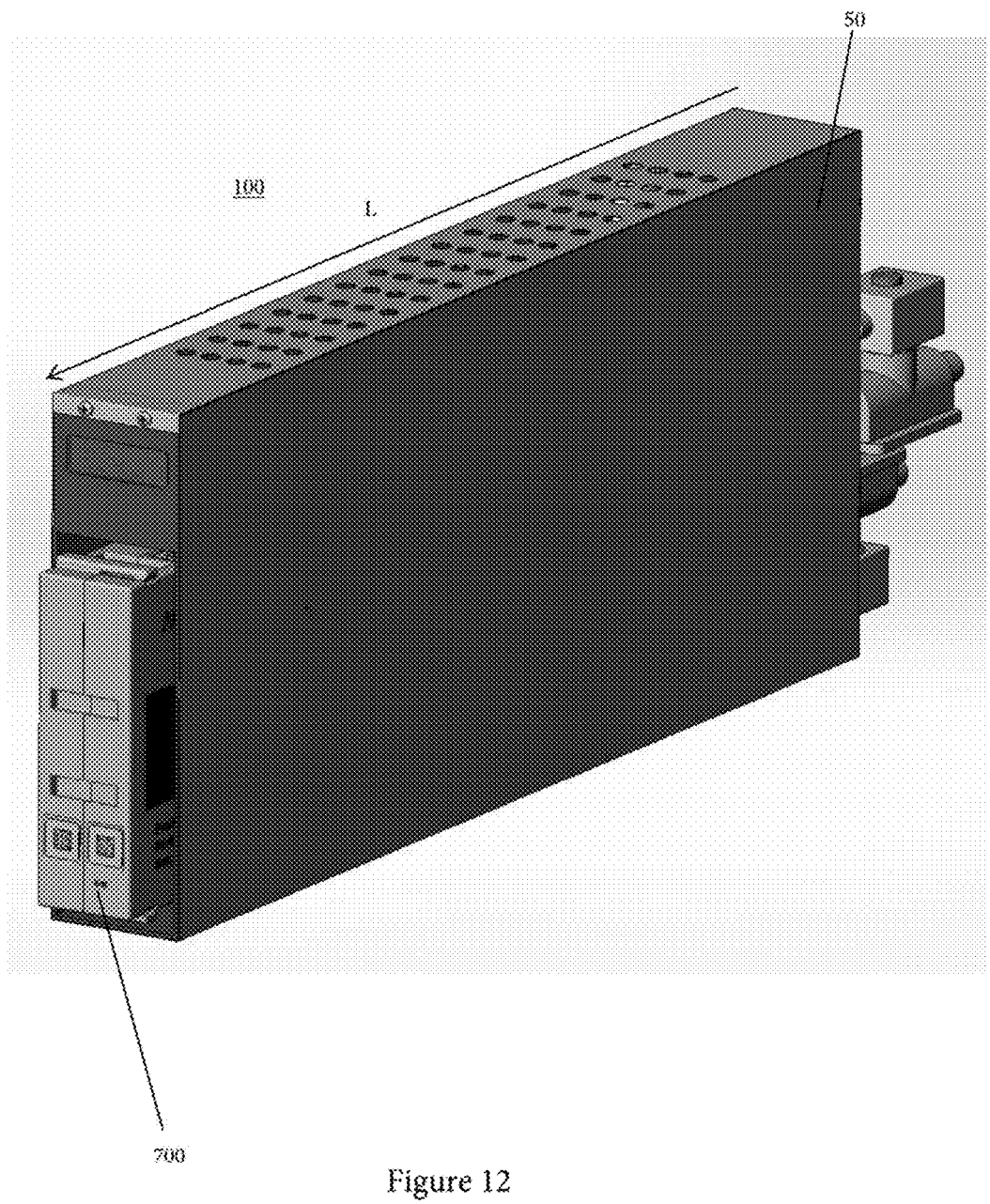
FIG. 12 illustrates a front perspective view of the DUT testing module of FIG. 10 in accordance with an embodiment, showing the DUT testing module with housing walls and showing a DUT receptacle inserted into the DUT testing module.

Now, a brief description will be given of the DUT testing module. FIG. 10 depicts a side view of a DUT testing module 100 in accordance with an embodiment, showing the DUT testing module 100 without housing walls and showing a DUT receptacle 700 inserted into the DUT testing module 100. FIG. 11 shows a front view of the DUT testing module 100 of FIG. 10 in accordance with an embodiment. FIG. 12 illustrates a front perspective view of the DUT testing module 100 of FIG. 10 in accordance with an embodiment, showing the DUT testing module 100 with housing walls and showing a DUT receptacle 700 inserted into the DUT testing module 100. It should be understood that the DUT testing module 100 is not limited to the illustrations in FIGS. 10-12.

FIG. 10 depicts a side view of a DUT (device under test) testing module 100 in accordance with an embodiment, showing the DUT testing module 100 without housing walls and showing a DUT receptacle 700 inserted into the DUT testing module 100.

As shown in FIG. 10, the DUT testing module 100 accepts the DUT receptacle 700 to establish an individualized automated testing environment. The DUT 800 (FIG. 7) inside the DUT receptacle 700 will be subjected to testing administered by the DUT testing module 100. The DUT testing module 100, the DUT receptacle 700, and the DUT 800 (FIG. 7) inside the DUT receptacle 700 are part of an individualized automated testing environment that is independent of any other DUT testing module, any other DUT receptacle, and/or any other DUT.

To support and operate in the individualized automated testing environment, the DUT testing module 100 includes an air mixing chamber 10, a docking unit 20, and a DUT test execution unit 30.

The air mixing chamber 10 outputs a mixed air flow to deliver to the interior of the DUT receptacle 700 via hose 18 while the DUT receptacle 700 permits interior air to exit via hose 19 to an external environment to ventilate or to travel to an air recycling mechanism. The mixed air flow is temperature controlled. For proper testing of the DUT 800 (FIG. 7) inside the DUT receptacle 700, test conditions may include a specific temperature or a range of temperatures to subject the DUT 800 before testing, during testing, and/or after testing. The DUT receptacle 700 includes a temperature sensor (not shown) in the interior of the DUT receptacle 700. The temperature sensor communicates with and reports measured temperature to the DUT testing module 100. Consequently, the interior temperature of the DUT receptacle 700 may be at a controlled temperature for testing by delivering the mixed air flow to the interior of the DUT receptacle 700 via hose 18 and by using the measured temperature from the temperature sensor (not shown) located in the interior of the DUT receptacle 700.

Continuing, the air mixing chamber 10 includes a first air inlet 12, a second air inlet 14, and an air outlet 16. The first air inlet 12 is operable to receive a first air flow. The second air inlet 14 is operable to receive a second air flow. The air outlet 16 is operable to output the mixed air flow via hose 18. A first valve 13 is coupled to the first air inlet 12. A second valve 15 is coupled to the second air inlet 14. Further, the first air flow is a high temperature air flow through the first air inlet 12. In an embodiment, the first air flow is at a temperature of 85° C. The second air flow is a low temperature air flow through the second air inlet 14. In an embodiment, the second air flow is at a temperature of −10° C.

In operation, the manipulation (e.g., via pneumatic control, via electronic control, or via any other manner) of the first valve 13 and the second valve 15 sends high temperature air flow and low temperature air flow into the air mixing chamber 10. Inside the air mixing chamber 10, the high temperature air flow and low temperature air flow mix together to stabilize at a controlled temperature. The controlled temperature may be adjusted by moving the first valve 13 and/or the second valve 15 towards either an opened position or a closed position. The controlled temperature may be ramp up or down or may be kept stable.

Focus is now on the docking unit 20 of the DUT testing module 100. The individualized automated testing environment is established by inserting the DUT receptacle 700 into the docking unit 20. In FIG. 11 (which shows a front view of the DUT testing module 100 of FIG. 10 in accordance with an embodiment), features of the docking unit 20 of the DUT testing module 100 are depicted. The front side 28 of the DUT testing module 100 and the docking unit 20 are illustrated in FIG. 11.

With respect to FIG. 11, the docking unit 20 includes a cavity 25, a first air opening 22, a second air opening 24, and an electrical connector 26. The cavity 25 receives and securely holds the DUT receptacle 700. Also, the cavity 25 eases and guides the DUT receptacle 700 during its insertion into the cavity 25. In an embodiment, the docking unit 20 is comprised of a plastic material (e.g., acetal homopolymer). The first air opening 22 is coupled to hose 18, which delivers the mixed air flow from the air mixing chamber 10 to the interior of the DUT receptacle 700. Moreover, the second air opening 24 is coupled to hose 19, which carries interior air from the DUT receptacle 700 to an external environment to ventilate or to an air recycling mechanism. Further, the electrical connector 26 permits electrical communication between the DUT receptacle 700 and the DUT testing module 100.

Referring still to FIG. 11, the rear side 750 (FIG. 9) of the DUT receptacle 700 is inserted into the cavity 25 of the docking unit 20. The shape of the cavity 25 is designed to accept the uniform size and shape and the uniform physical/air/electrical interface offered by the DUT receptacle 700, facilitating insertion of the DUT receptacle 700 by an automated mechanism (e.g., a gripper) into the cavity 25 irrespective of the device type, size, and form factor of the DUT 800 (FIG. 7) inside the DUT receptacle 700. The rear side 750 (FIG. 9) of the DUT receptacle 700 is sufficiently inserted to enable the second connector 714 (FIG. 9) of the DUT receptacle 700 to mate with the electrical connector 26 of the docking unit 20, to enable the first air guide 722 (FIG. 9) of the DUT receptacle 700 to mate with the first air opening 22 of the docking unit 20, and to enable the second air guide 724 (FIG. 9) of the DUT receptacle 700 to mate with the second air opening 24 of the docking unit 20.

Returning to FIG. 10, the DUT testing module 100 includes a DUT test execution unit 30 and an intermediate connector 32 in accordance with an embodiment. The DUT test execution unit 30 includes a connector 31. The connector 31 is coupled to the intermediate connector 32, which is coupled to the connector 26 of the docking unit 20. The intermediate connector 32 protects the connector 31 from the wear and tear over time associated with insertion and removal of the DUT receptacle 700 with respect to the cavity 25, avoiding the need to replace the DUT test execution unit 30 due to damage to the connector 31. In an embodiment, the intermediate connector 32 and the connector 26 are easily replaceable. In an alternate embodiment, the connector 31 directly connects with the connector 26 of the docking unit 20.

Operating in the individualized automated testing environment established by the DUT testing module 100 and the DUT receptacle 700, the DUT test execution unit 30 is operable to perform a test on the DUT 800 (FIG. 7) that is inside of the DUT receptacle 700. The DUT test execution unit 30 further includes electronic components to enable the DUT test execution unit 30 to set-up, start, monitor, log, and end a test for the DUT 800 (FIG. 7) that is inside of the DUT receptacle 700. In an embodiment, the test is custom selected based on identification information of the DUT 800 (FIG. 7). For example, if the identification information of the DUT 800 (FIG. 7) designates the DUT 800 (FIG. 7) as being a SSD with 500 GB storage capacity and a specific set of features, a customized test for the SSD with 500 GB storage capacity and the specific set of features will be selected. Further, if the identification information of the DUT 800 (FIG. 7) designates the DUT 800 (FIG. 7) as being a SSD with 1 TB storage capacity and a specific group of features, a customized test for the SSD with 1 TB storage capacity and the specific group of features will be selected.

In an embodiment, the DUT test execution unit 30 electronically communicates through the connector 31, the connector 32, and the connector 26, which is coupled to the second connector 714 (FIG. 9) of the DUT receptacle 700, i) to send test inputs, test commands, and/or any other input information to or ii) to receive test outputs, test responses, and/or any other output information from the DUT 800 (FIG. 7) inside the DUT receptacle 700. The second connector 714 (FIGS. 7 and 9) of the DUT receptacle 700 electrically communicates with the electrical interface 710 (FIG. 7) of the DUT receptacle 700, which electrically communicates with the DUT 800 (FIG. 7) via the first connector 712 (FIG. 7).

Further, the DUT test execution unit 30 ensures the air mixing chamber 10 furnishes the controlled temperature to the DUT receptacle 700 to comply with the test conditions of the test performed on the DUT 800 (FIG. 7) that is inside of the DUT receptacle 700. Moreover, via the connector 31, the connector 32, and the connector 26, which is coupled to the second connector 714 (FIG. 9) of the DUT receptacle 700, the DUT test execution unit 30 receives the measured temperature from the temperature sensor (not shown) located in the interior of the DUT receptacle 700 and makes appropriate adjustments to the controlled temperature to comply with the test conditions of the test performed on the DUT 800 (FIG. 7) that is inside of the DUT receptacle 700.

There are many different types of tests which the DUT 800 (FIG. 7) that is inside of the DUT receptacle 700 may be subjected. The different types of tests include, but not limited to, functionality tests, reliability tests, and stress tests. There are also different types of tests that may be variations of or subtypes of the functionality tests, reliability tests, and stress tests. The goal of a functionality test is to determine whether the DUT 800 (FIG. 7) operates as it is designed to operate. This may include characterizing a plurality of properties, such as clock speed, power usage, response time, etc. The aim of a reliability test is to determine how aging, temperature, and other factors affect the useful lifetime of the DUT 800 (FIG. 7). Accelerated aging of the DUT 800 (FIG. 7) may be achieved by operating the DUT 800 (FIG. 7) in a high temperature environment for an extended period of time. This is also referred to as a burn-in test. Further, the objective of a stress test is to uncover the impact of extreme conditions, such as unusual cold temperature, unusual hot temperature, high voltages, high currents, and etc., on the DUT 800 (FIG. 7). For example, military and heavy industrial environments regularly experience extreme conditions.

In an embodiment, the DUT testing module 100 is configurable by exchanging its DUT test execution unit 30 for another DUT test execution unit 30. As discussed above, there are many different types of tests which the DUT 800 (FIG. 7) that is inside of the DUT receptacle 700 may be subjected. To perform a functionality test, the DUT test execution unit 30 is designed with a wide variety of features and high performance electronics, which are more than sufficient to also perform a reliability test or a stress test. This design is a high cost design. However, to perform either a reliability test or a stress test, a limited set of features and modest performance electronics are sufficient to enable the DUT test execution unit 30 to perform the test task, reducing costs. Accordingly, there may be variations of the DUT testing module 100. In an embodiment, the DUT test execution unit 30 with the wide variety of features and high performance electronics is selected and incorporated into a DUT testing module 100 focused on performing the functionality test while the DUT test execution unit 30 with the limited set of features and modest performance electronics is selected and incorporated into a DUT testing module 100 focused on performing either the reliability test or the stress test.

FIG. 12 illustrates a front perspective view of the DUT testing module 100 of FIG. 10 in accordance with an embodiment, showing the DUT testing module 100 with housing walls and showing a DUT receptacle 700 inserted into the DUT testing module 100. As depicted in FIG. 12, the DUT testing module 100 includes a housing 50 that at least partially encloses the air mixing chamber 10, the docking unit 20, and the DUT test execution unit 30. Moreover, the DUT testing module 100 has a length L. In an embodiment, the housing 50 is comprised of steel sheet metal.

Tester

Figure 13:
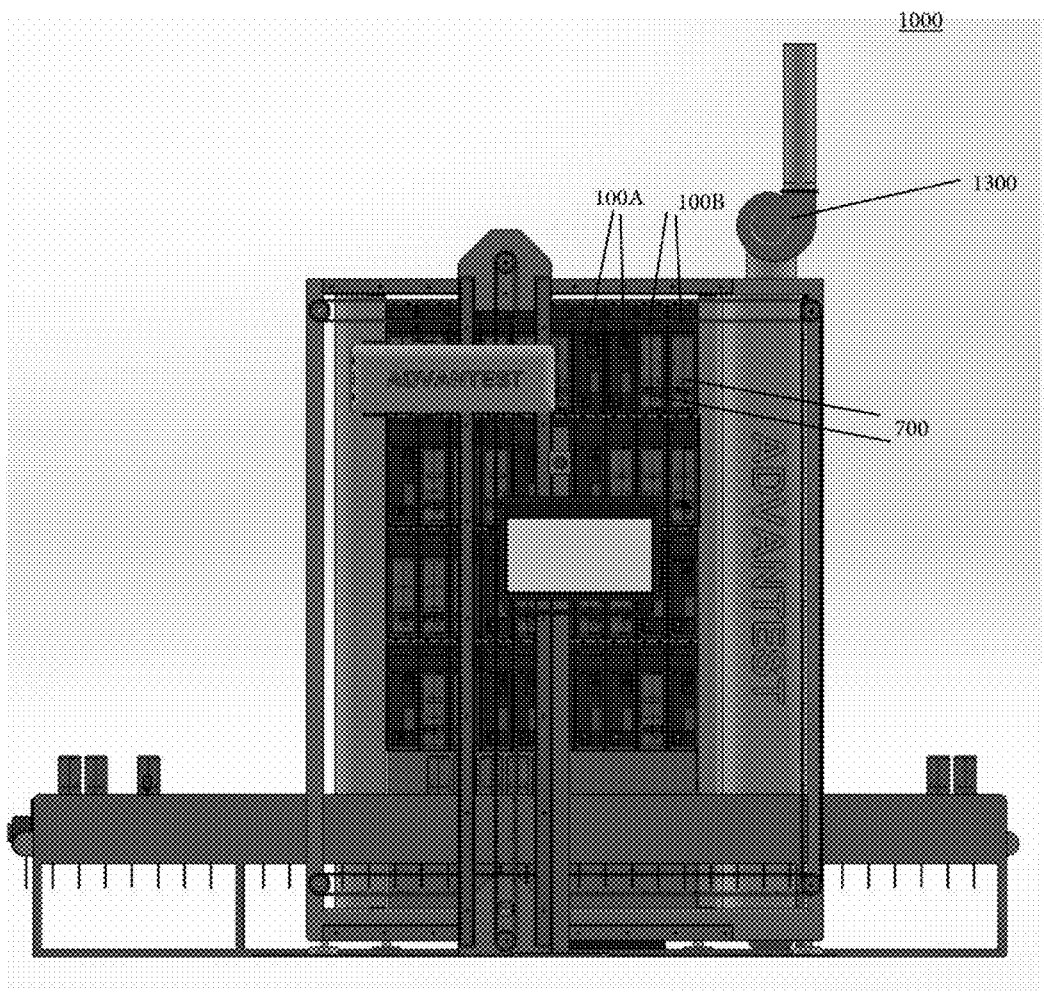
FIG. 13 illustrates a front side of a tester in accordance with an embodiment, showing DUT testing modules and DUT receptacles.

Now, a brief description will be given of the tester. With the housing 50 installed, the DUT testing module 100 may be operated as an exchangeable or replaceable module of a tester 1000 as depicted in FIG. 13. Specifically, FIG. 13 illustrates a front side of a tester 1000 in accordance with an embodiment, showing DUT testing modules 100A and 100B and DUT receptacles 700. As shown in FIG. 13, the tester 1000 includes a plurality of DUT testing modules 100A and 100B. The description of the DUT testing module 100 is equally applicable to DUT testing modules 100A and 100B. DUT receptacles 700 are inserted in the DUT testing modules 100B but not in the DUT testing modules 100A on the front side of the tester 1000. It should be understood that the tester 1000 is not limited to the illustration of FIG. 13.

Continuing with FIG. 13, the tester 1000 offers numerous features for operating the individualized automated testing environments established by the DUT testing modules 100A and 100B in combination with the DUT receptacles 700. The tester 1000 is configured to supply power to the DUT testing modules 100A and 100B and the DUT receptacles 700 via DUT testing modules 100A and 100B. Additionally, the tester 1000 includes a high temperature air source (not shown) and a low temperature air source (not shown). The high temperature air source (not shown) may be coupled to the first valve 13 (FIG. 10), which is coupled to the first air inlet 12 (FIG. 10) of DUT testing modules 100 (FIG. 10), 100A, and 100B. The first air inlet 12 is operable to receive the high temperature air flow. In an embodiment, the high temperature air flow is at a temperature of 85° C. The low temperature air source (not shown) may be coupled to the second valve 15 (FIG. 10), which is coupled to the second air inlet 14 (FIG. 10). The second air inlet 14 is operable to receive the low temperature air flow. In an embodiment, the low temperature air flow is at a temperature of −10° C.

Further, the tester 1000 has a negative pressure blower 1300. In operation, the negative pressure blower 1300 forces or directs the interior air from the DUT receptacles 700 to an external environment to ventilate or to an air recycling mechanism. The interior air from the DUT receptacles 700 travels via the hose 19 (FIG. 10) coupled to the second air opening 24 (FIG. 10) of the DUT testing modules 100 (FIG. 10), 100A, and 100B.

In sum, the tester 1000 is a self-contained unit. Moreover, the tester 1000 facilitates simultaneous operation of individualized automated testing environments (established by the DUT testing modules 100A and 100B in combination with the DUT receptacles 700) which may involve different types of DUTs 800 (FIG. 7) undergoing different types of tests and/or progressing at different stages of testing while the DUTs 800 (FIG. 7) are at different controlled temperatures within the interior of the DUT receptacles 700.

Test Floor Equipment

Now, detailed description of test floor equipment will be provided. The test floor equipment along with DUT testing modules, testers, and automated control implement the individualized automated testing environment of the new paradigm for automated device testing.

Figure 1:
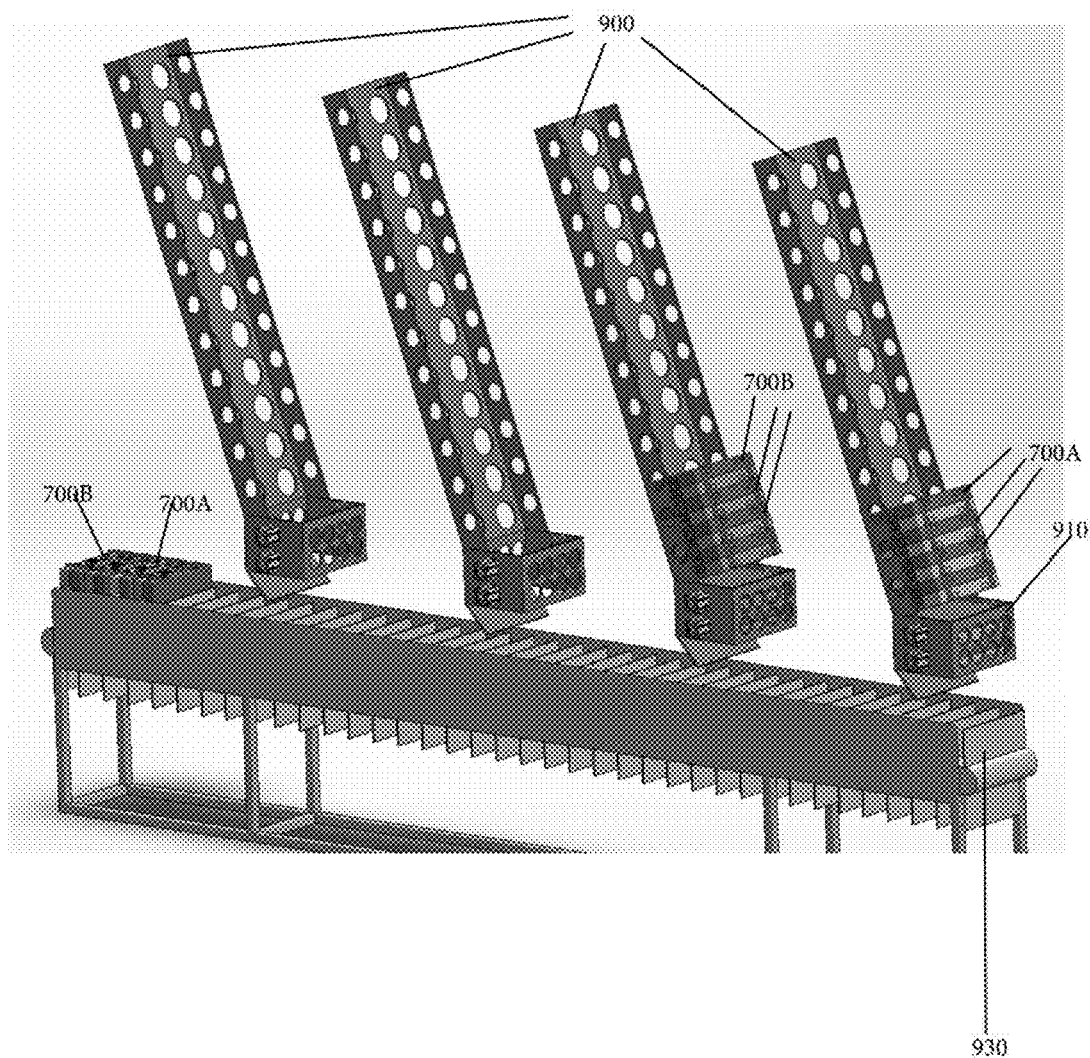
FIG. 1 depicts a plurality of vertical stack buffers in a test floor in accordance with an embodiment, showing DUT receptacles of different types before a DUT or DUTs is inserted inside the DUT receptacles.

FIG. 1 depicts a plurality of vertical stack buffers 900 in a test floor in accordance with an embodiment, showing DUT receptacles 700A and 700B of different types before a DUT or DUTs 800 (FIG. 7) is inserted inside the DUT receptacles 700A and 700B. It should be understood that the vertical stack buffers 900 are not limited to the illustrations of FIGS. 1, 2, 4 and 6.

The DUT receptacles 700A and 700B provide a uniform size and shape and a uniform physical/air/electrical interface for a DUT 800 (FIG. 7). There are may different types of devices (or DUTs) including, but not limited to, network cards, graphics cards, chips, microprocessors, hard disk drives (HDD), and solid state drives (SSD). Even within these exemplary device types, there are different device sub-types. Moreover, there are numerous form factors and published specifications for devices to comply with to support compatibility and interoperability. Examples of form factors and published specifications include, but are not limited to, 3.5" HDD, 2.5" HDD, 2.5" SSD, 1.8" SSD, SATA, iSATA, PCIe, mPCIe, Fibre Channel, SAS, and USB.

Rather than designing automated testing equipment (e.g., DUT testing modules, testers, test floor equipment, and/or automated control) for a specific device type and/or a specific form factor and/or a specific published specification, the automated testing equipment (e.g., DUT testing modules, testers, test floor equipment, and/or automated control) is crafted for the uniform size and shape and the uniform physical/air/electrical interface offered by the DUT receptacles 700A and 700B. Consequently, the automated testing equipment (e.g., DUT testing modules, testers, test floor equipment, and/or automated control) may be utilized with different types of devices (or DUTs) of different form factors and different published specifications.

In an embodiment, each DUT receptacle 700A and 700B is designed to function with a DUT or DUTs 800 (FIG. 7) of one or more device type, one or more form factor, and/or one or more published specification. The interior and the electronic interface 710 (FIG. 7) of each DUT receptacle 700A and 700B are shaped and configured to properly accommodate and operate with a subset of the large number of possible design choices when device type, form factor, and/or published specification are taken into consideration. For example, the DUT receptacle 700A may be designed for a SSD with 500 GB storage capacity, 2.5" SSD form factor, and compliant with the SAS specification while the DUT receptacle 700B may be designed for a SSD with 1 TB storage capacity, 1.8" SSD form factor, and compliant with the SATA specification. It should be understood that DUT receptacle 700A and DUT receptacle 700B may properly accommodate and operate with the exemplary design choices as well as with additional devices of different device type, different form factor, and/or different published specification.

Any number of ways may be used to identify the DUT receptacle type to enable test floor equipment to recognize and have knowledge of the DUT receptacle type. A linear barcode or a matrix barcode may be attached to the exterior of each DUT receptacle 700A and 700B to identify the DUT receptacle type. Other indicia may also be utilized to identify the DUT receptacle type.

Continuing with FIG. 1, each vertical stack buffer 900 is configured and is operable to hold the DUT receptacles 700A and 700B in a stack manner before a DUT 800 or DUTs (FIG. 7) is inserted inside the DUT receptacles 700A and 700B. That is, the DUT receptacles 700A and 700B are empty when held by the vertical stack buffers 900. A DUT receptacle type may be assigned to a vertical stack buffer 900. Alternatively, a vertical stack buffer 900 may be shared by more than one DUT receptacle type. The vertical stack buffers 900 may be filled with the DUT receptacles 700A and 700B in an automated manner or manually.

The vertical stack buffer 900 operates cooperatively with a conveyor 930. The conveyor 930 may be a flighted index conveyor in accordance with an embodiment. The conveyor 930 holds the DUT receptacle 700A and 700B upright and moves it towards a station where the DUT 800 (FIG. 7) will be inserted into DUT receptacle 700A and 700B. Additionally, the vertical stack buffer 900 includes a release mechanism 910 to release and drop a single DUT receptacle 700A and 700B at a time on the conveyor 930 when a specific DUT receptacle type is needed in view of the corresponding DUT 800 (FIG. 7) to be tested. That is, a single DUT receptacle 700A and 700B may be placed or dropped on the conveyor 930 on-demand. Using the example of above, if a SSD with 500 GB storage capacity, 2.5" SSD form factor, and compliant with the SAS specification will be tested, the release mechanism 910 of the vertical stack buffer 900 places the DUT receptacle 700A on the conveyor 930. However, if a SSD with 1 TB storage capacity, 1.8" SSD form factor, and compliant with the SATA specification will be tested, the release mechanism 910 of the vertical stack buffer 900 places the DUT receptacle 700B on the conveyor 930.

Figure 2:
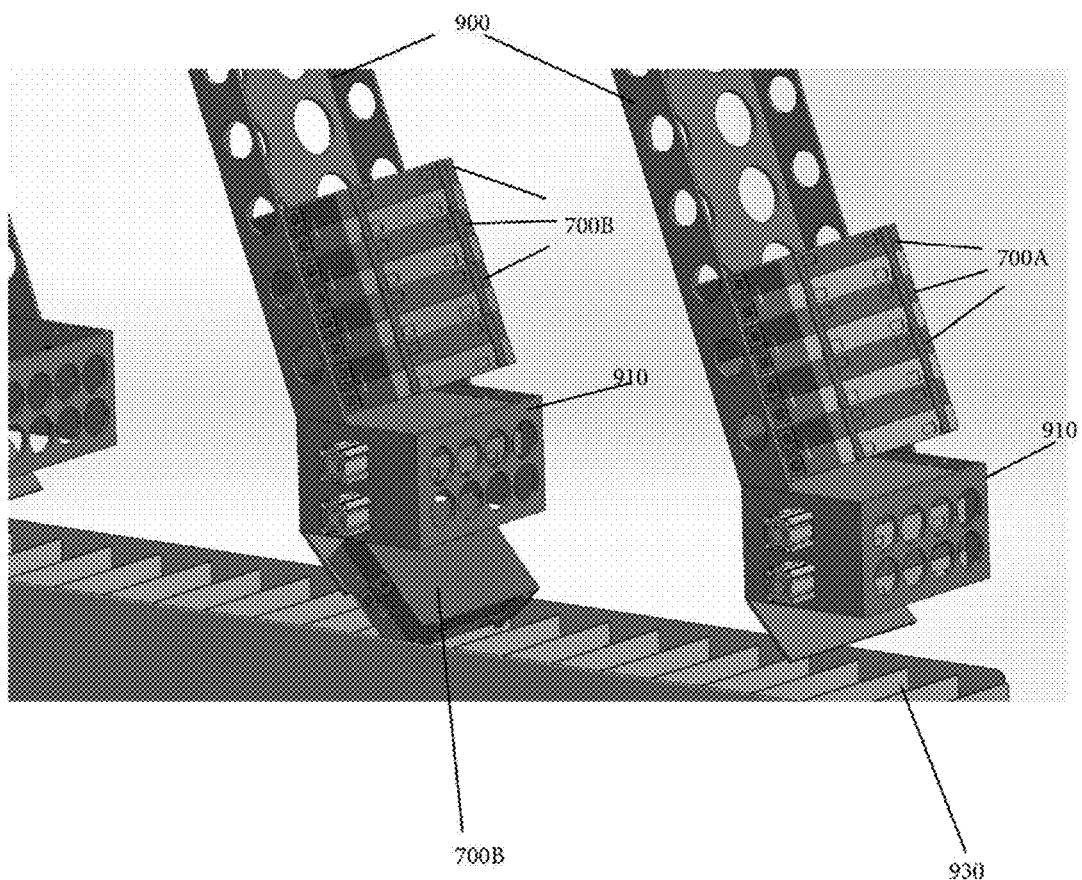
FIG. 2 depicts a close-up view of the plurality of vertical stack buffers of FIG. 1 in accordance with an embodiment, showing DUT receptacles of different types.

FIG. 2 depicts a close-up view of the plurality of vertical stack buffers 900 of FIG. 1 in accordance with an embodiment, showing DUT receptacles 700A and 700B of different types before a DUT or DUTs 800 (FIG. 7) is inserted inside the DUT receptacles 700A and 700B. In FIG. 2, the release mechanism 910 of the vertical stack buffer 900 is placing or dropping the DUT receptacle 700B on the conveyor 930.

Figure 3:
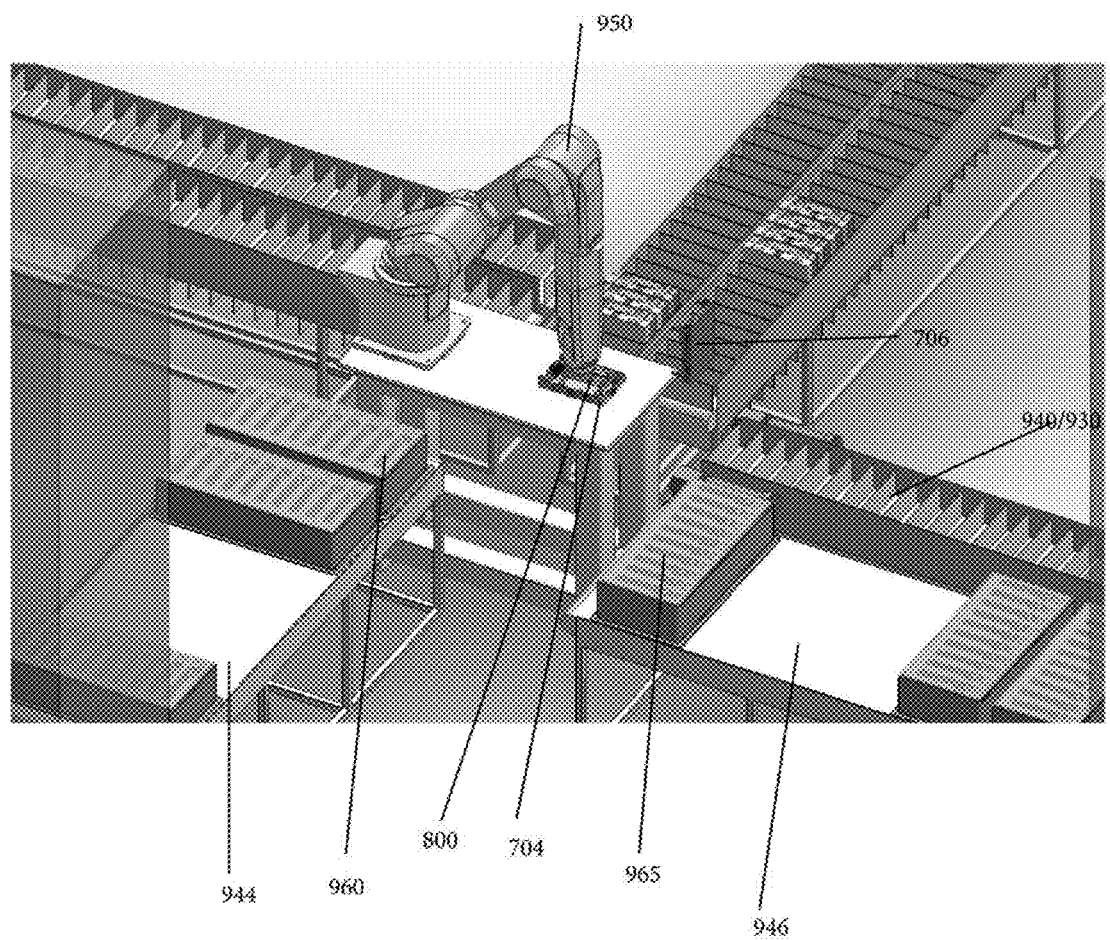
FIG. 3 illustrates an automated handling station in a test floor in accordance with an embodiment.

Now focusing on FIG. 3, an automated handling station 950 in a test floor is illustrated in accordance with an embodiment. The automated handling station 950 is not limited to the illustrations of FIGS. 3, 4, and 6.

In an embodiment, the automated handling station 950 is implemented as a robotic apparatus. The automated handling station 950 is operable to access the DUT receptacle 700A and 700B (FIG. 1) from either the conveyor 930 (FIG. 1) or a conveyor 940 if the DUT receptacle 700A and 700B (FIG. 1) transitions from the conveyor 930 (FIG. 1) to the conveyor 940. Further, the automated handling station 950 is operable to open the DUT receptacle 700A and 700B (FIG. 1) to position a corresponding DUT 800 in a manner that couples the corresponding DUT 800 to an electrical interface 710 (FIG. 7) of the DUT receptacle 700A and 700B (FIG. 1). Also, the automated handling station 950 positions the corresponding DUT 800 in a manner that encloses the corresponding DUT 800 inside the DUT receptacle 700A and 700B (FIG. 1) to facilitate testing of the corresponding DUT 800 with a DUT testing module 100 (FIG. 10), 100A (FIG. 13), and 100B (FIG. 13) of a tester 1000 (FIG. 13). After testing, the automated handling station 950 is operable to open the DUT receptacle 700A and 700B (FIG. 1) and unload the corresponding DUT 800.

The DUT testing module 100 (FIG. 10), 100A (FIG. 13), and 100B (FIG. 13) of the tester 1000 (FIG. 13) is operable to receive and hold the DUT receptacle 700A and 700B (FIG. 1). Also, the DUT testing module 100 (FIG. 10), 100A (FIG. 13), and 100B (FIG. 13) of the tester 1000 (FIG. 13) is operable to couple to and to use the electrical interface 710 (FIG. 7) and the air flow interface 720 (FIG. 7) to perform a test at a controlled temperature on the corresponding DUT 800 that is inside of the DUT receptacle 700A and 700B (FIG. 1). Further, the DUT testing module 100 (FIG. 10), 100A (FIG. 13), and 100B (FIG. 13) of the tester 1000 (FIG. 13) is operable to use the electrical interface 710 (FIG. 7) to send input information to and to receive output information from the corresponding DUT 800.

As shown in FIG. 3, the automated handling station 950 has separated the base 704 (which rests on a working surface) and the lid 706 (which is held upright by a lid holder) of a DUT receptacle to load the DUT 800. In an embodiment, a pre-test tote 960 moved by a conveyor 944 may carry the DUT 800 to the automated handling station 950 for loading into the DUT receptacle 700A and 700B (FIG. 1) while a post-test tote 965 moved by a conveyor 946 may carry the DUT 800 unloaded from the DUT receptacle 700A and 700B (FIG. 1) after testing away from the automated handling station 950.

Figure 4:
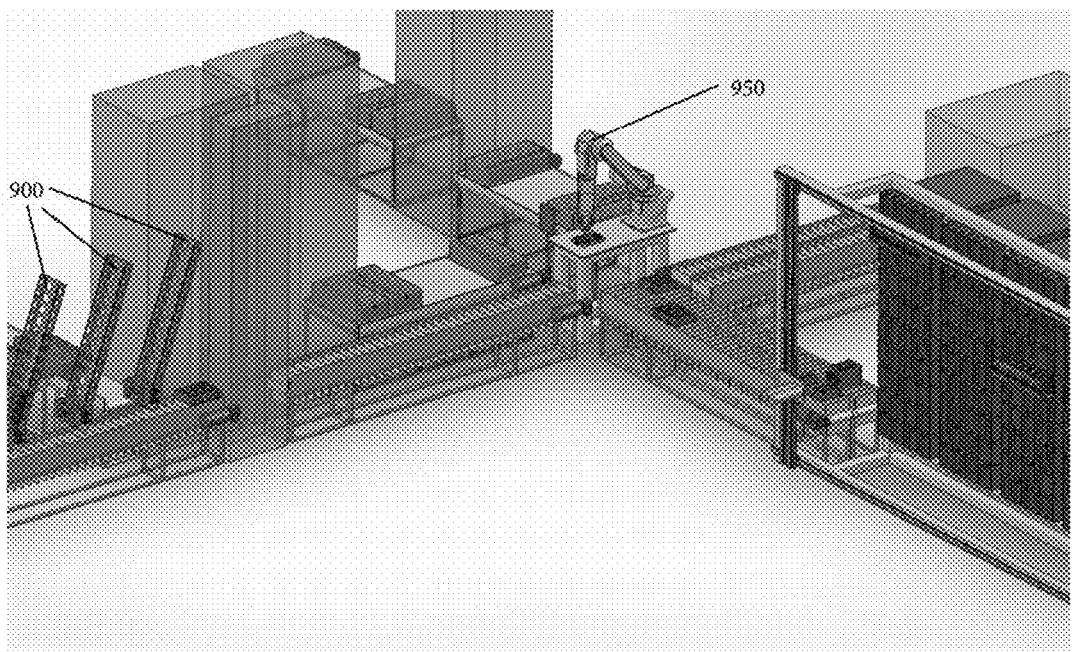
FIG. 4 illustrates the plurality of vertical stack buffers of FIG. 1 and the automated handling station of FIG. 3 in a test floor in accordance with an embodiment.

FIG. 4 illustrates the plurality of vertical stack buffers 900 of FIG. 1 and the automated handling station 950 of FIG. 3 in a test floor in accordance with an embodiment. In particular, the position of the plurality of vertical stack buffers 900 of FIG. 1 relative to the position of the automated handling station 950 of FIG. 3 is depicted in accordance with an embodiment.

Figure 5:
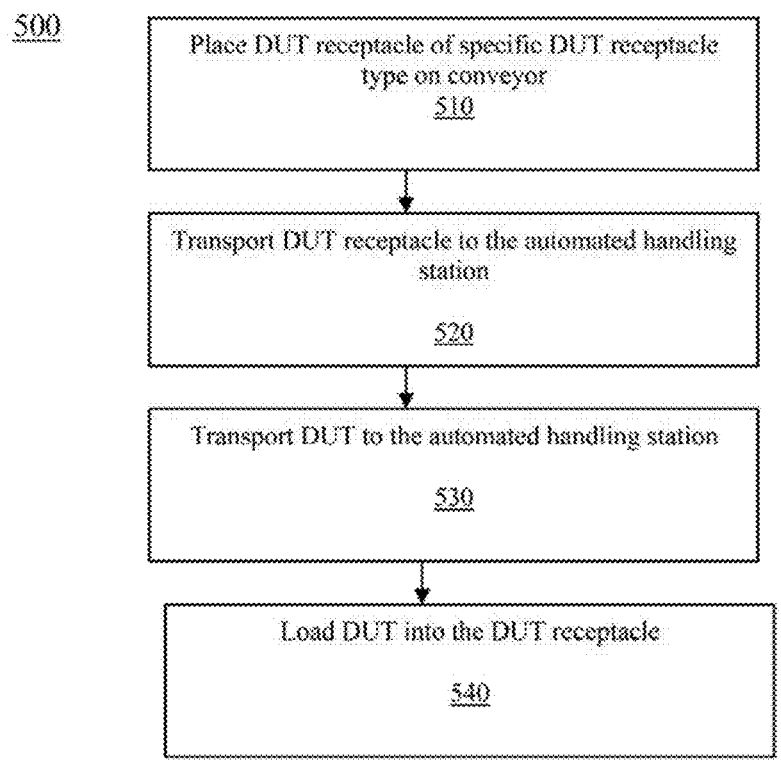
FIG. 5 illustrates a method of operating the plurality of vertical stack buffers of FIG. 1 and the automated handling station of FIG. 3 in accordance with an embodiment.

FIG. 5 illustrates a method 500 of operating the plurality of vertical stack buffers 900 of FIG. 1 and the automated handling station 950 of FIG. 3 in accordance with an embodiment.

As depicted in FIG. 1, the vertical stack buffers 900 hold a first DUT receptacle type referred to as the DUT receptacles 700A and a second DUT receptacle type referred to as the DUT receptacles 700B. Using the example of above, if the DUT 800 (FIGS. 3 and 7) selected to be tested is a SSD with 500 GB storage capacity, 2.5" SSD form factor, and compliant with the SAS specification, the release mechanism 910 of the vertical stack buffer 900 is instructed or controlled to place the DUT receptacle 700A on the conveyor 930, at 510 (FIG. 5). That is, the release mechanism 910 of the vertical stack buffer 900 responds to the selection of the DUT 800 (FIGS. 3 and 7) by dropping an appropriate or corresponding DUT receptacle on the conveyor 930. At 520 (FIG. 5), the conveyor 930 transports the DUT receptacle 700A (FIG. 1) toward the automated handling station 950 (FIG. 3).

Similarly, the DUT 800 (FIGS. 3 and 7), which is a SSD with 500 GB storage capacity, 2.5" SSD form factor, and compliant with the SAS specification, is transported to the automated handling station 950 (FIG. 3) by a pre-test tote 960 (FIG. 3) on the conveyor 944 (FIG. 3), at 530 (FIG. 5).

Further, the automated handling station 950 (FIG. 3) accesses and opens the DUT receptacle 700A (FIGS. 1 and 3) and accesses and loads the DUT 800 (FIGS. 3 and 7) into the DUT receptacle 700A (FIGS. 1 and 3), at 540 (FIG. 5). The automated handling station 950 (FIG. 3) positions the DUT 800 (FIGS. 3 and 7) in a manner that couples the DUT 800 (FIGS. 3 and 7) to an electrical interface 710 (FIG. 7) of the DUT receptacle 700A (FIGS. 1 and 3) and that encloses the DUT 800 (FIGS. 3 and 7) inside the DUT receptacle 700A (FIGS. 1 and 3) to facilitate testing of the DUT 800 (FIGS. 3 and 7). After testing, the automated handling station 950 opens the DUT receptacle 700A (FIGS. 1 and 3) and unloads the DUT 800 (FIGS. 3 and 7), which is a SSD with 500 GB storage capacity, 2.5″ SSD form factor, and compliant with the SAS specification in this case.

Figure 6:
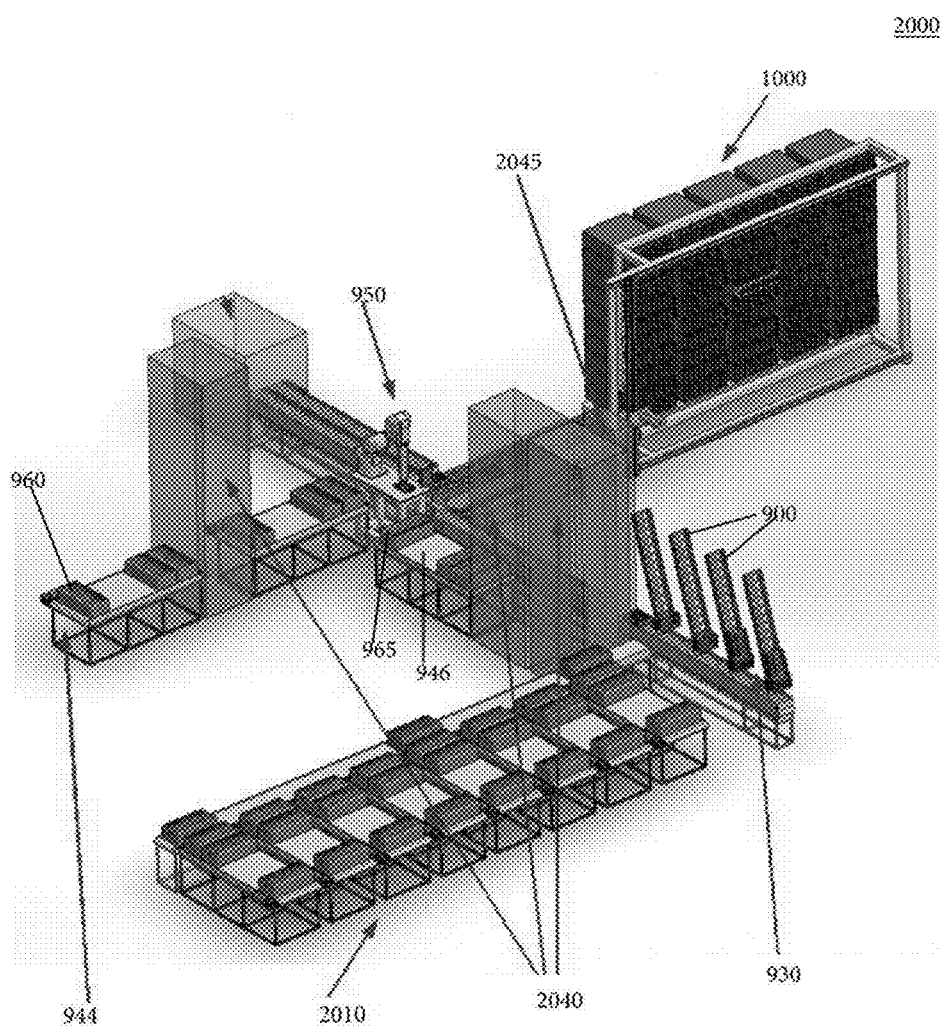
FIG. 6 depicts a test floor system in accordance with an embodiment.

FIG. 6 depicts a test floor system 2000 in accordance with an embodiment. The test floor system 2000 includes various stations and automated test floor equipment (e.g., tester 1000, automated handling station 950, vertical stack buffers 900, conveyor 930, binning station 2010, pre-test tote 960, conveyor 944, post-test tote 965, conveyor 946, vertical rotating buffers for totes 2040, and vertical rotating buffer for DUT receptacles 2045). In accordance with an embodiment, the various stations and automated test floor equipment (e.g., tester 1000, automated handling station 950, vertical stack buffers 900, conveyor 930, binning station 2010, pre-test tote 960, conveyor 944, post-test tote 965, conveyor 946, vertical rotating buffers for totes 2040, and vertical rotating buffer for DUT receptacles 2045) of the test floor system 2000 operate cooperatively by being configured to communicate with each other or with a central controller and by being configured to track or monitor their operations. This achieves the implementation of automated testing of different types of devices (or DUTs) of different form factors and different published specifications on a single platform (or test floor) of the test floor system 2000.

The foregoing descriptions of specific embodiments have been presented for purposes of illustration and description. They are not intended to be exhaustive or to limit the disclosure to the precise forms disclosed, and many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is intended that the scope of the disclosure be defined by the Claims appended hereto and their equivalents.

What is claimed is:

1. A test floor apparatus, comprising:
   at least one conveyor;
   a vertical stack buffer operable to hold a plurality of DUT (device under test) receptacles and operable to place a DUT receptacle on the at least one conveyor to enable a corresponding DUT to be inserted into the DUT receptacle;
   an automated handling station operable to access the DUT receptacle from the at least one conveyor and operable to open the DUT receptacle to position the corresponding DUT in a manner that couples the corresponding DUT to an electrical interface of the DUT receptacle and that encloses the corresponding DUT inside the DUT receptacle to facilitate testing of the corresponding DUT; and
   a tester including a DUT testing module operable to couple to the DUT receptacle, wherein the DUT testing module comprises a first air hose operable to deliver an air flow into the DUT receptacle and a second air hose operable to carry out an interior air flow from inside the DUT receptacle.

2. The test floor apparatus of claim 1, wherein the corresponding DUT comprises one of a plurality of different device types.

3. The test floor apparatus of claim 2, wherein the plurality of different device types includes a first solid state drive having a first storage capacity and a second solid state drive having a second storage capacity.

4. The test floor apparatus of claim 2, wherein the plurality of different device types includes a first solid state drive comprising a first form factor and a second solid state drive comprising a second form factor.

5. The test floor apparatus of claim 2, wherein the plurality of different device types includes a first solid state drive compliant with a first specification and a second solid state drive compliant with a second specification.

6. The test floor apparatus of claim 1, wherein the DUT receptacle includes the electrical interface and an air flow interface.

7. The test floor apparatus of claim 6, wherein the DUT testing module is operable to receive and hold the DUT receptacle.

8. The test floor apparatus of claim 7, wherein the DUT testing module is operable to couple to and to use the electrical interface and the air flow interface to perform a test at a controlled temperature on the corresponding DUT that is inside of the DUT receptacle.

9. The test floor apparatus of claim 8, wherein the DUT testing module is operable to use the electrical interface to send input information to and to receive output information from the corresponding DUT.

10. A test floor apparatus, comprising:
    at least one conveyor;
    a first vertical stack buffer operable to hold a plurality of first type DUT (device under test) receptacles and operable to place a first type DUT receptacle on the at least one conveyor to enable a first type DUT to be inserted into the first type DUT receptacle;
    a second vertical stack buffer operable to hold a plurality of second type DUT receptacles and operable to place a second type DUT receptacle on the at least one conveyor to enable a second type DUT to be inserted into the second type DUT receptacle;
    an automated handling station operable to access at least one of the first type DUT receptacle or the second type DUT receptacle from the at least one conveyor and operable to open the at least one of the first type DUT receptacle or the second type DUT receptacle to position at least one of the first type DUT or the second type DUT in a manner that couples the at least one of the first type DUT or the second type DUT to an electrical interface of the at least one of the first type DUT receptacle or the second type DUT receptacle and that encloses the at least one of the first type DUT or the second type DUT inside the at least one of the first type DUT receptacle or the second type DUT receptacle to facilitate testing of the at least one of the first type DUT or the second type DUT; and
    a tester including a DUT testing module operable to couple to the at least one of the first type DUT receptacle or the second type DUT receptacle, wherein the DUT testing module comprises a first air hose operable to deliver an air flow into the at least one of the first type DUT receptacle or the second type DUT receptacle and a second air hose operable to carry out an interior air flow from inside the at least one of the first type DUT receptacle or the second type DUT receptacle.

11. The test floor apparatus of claim 10, wherein the first type DUT comprises one of a plurality of different device types, and wherein the second type DUT comprises one of the plurality of different device types.

12. The test floor apparatus of claim 11, wherein the plurality of different device types includes a first solid state drive having a first storage capacity and a second solid state drive having a second storage capacity.

13. The test floor apparatus of claim 11, wherein the plurality of different device types includes a first solid state drive comprising a first form factor and a second solid state drive comprising a second form factor.

14. The test floor apparatus of claim 11, wherein the plurality of different device types includes a first solid state drive compliant with a first specification and a second solid state drive compliant with a second specification.

15. The test floor apparatus of claim 10, wherein size and shape of the first type DUT receptacle is uniform with size and shape of the second type DUT receptacle.

16. The test floor apparatus of claim 10, wherein the DUT testing module is operable to receive and hold the at least one of the first type DUT receptacle or the second type DUT receptacle.

17. The test floor apparatus of claim 16, wherein the DUT testing module is operable to couple to and to use the electrical interface to perform a test at a controlled temperature on the at least one of the first type DUT or the second type DUT that is inside of the at least one of the first type DUT receptacle or the second type DUT receptacle, and wherein the DUT testing module is further operable to use the electrical interface to send input information to and to receive output information from the at least one of the first type DUT or the second type DUT.

18. A method, comprising responsive to selection of a first type DUT (device under test) on which to perform testing, causing a first type DUT receptacle to be placed on a first conveyor by one of a plurality of vertical stack buffers operable to hold a plurality of types of DUT receptacles;

using the first conveyor to transport the first type DUT receptacle;

using a second conveyor to transport the first type DUT;

accessing the first type DUT receptacle and opening the first type DUT receptacle;

accessing the first type DUT from the second conveyor and positioning the first type DUT in a manner that couples the first type DUT to an electrical interface of the first type DUT receptacle and that encloses the first type DUT inside the first type DUT receptacle to facilitate testing of the first type DUT; and coupling the first type DUT receptacle to a DUT testing module comprising a first air hose operable to deliver an air flow into the first type DUT receptacle and a second air hose operable to carry out an interior air flow from inside the first type DUT receptacle.

19. The method of claim 18, wherein the first type DUT comprises one of a plurality of different device types, and wherein the plurality of different device types includes a first solid state drive having a first storage capacity and a second solid state drive having a second storage capacity.

20. The method of claim 18,
wherein the DUT testing module is operable to receive and hold the first type DUT receptacle, wherein the DUT testing module is operable to couple to and to use the electrical interface to perform a test at a controlled temperature on the first type DUT that is inside of the first type DUT receptacle, and wherein the DUT testing module is further operable to use the electrical interface to send input information to and to receive output information from the first type DUT.

* * * * *